United States Patent [19]

Kojima et al.

[11] Patent Number: 5,092,978
[45] Date of Patent: Mar. 3, 1992

[54] APPARATUS FOR FABRICATING PIEZOELECTRIC FILMS

[75] Inventors: Kiyoaki Kojima; Yoshiki Chubachi; Kazushi Aoyama, all of Tokyo, Japan

[73] Assignee: Clarion Co., Ltd., Tokyo, Japan

[21] Appl. No.: 632,345

[22] Filed: Dec. 21, 1990

[51] Int. Cl.⁵ .................................. C23C 14/34
[52] U.S. Cl. .................. 204/298.15; 204/298.23; 204/192.12
[58] Field of Search ............ 204/192.18, 298.06, 204/298.08, 298.15, 298.23, 192.12

[56] References Cited

U.S. PATENT DOCUMENTS 3,704,219 11/1972 McDowell .............. 204/298.08 X
4,399,016 8/1983 Tsukada et al. ........ 204/298.15 X
4,897,171 1/1990 Ohmi ..................... 204/298.15

FOREIGN PATENT DOCUMENTS 0136124 10/1980 Japan ..................... 204/192.18

OTHER PUBLICATIONS

M. Ambersley et al., "Piezoelectric . . . Sputtering", Thin Solid Films, 80 (1981), pp. 183-195.
Khuri-Takub et al., "Studies . . . ZnO Films", J. of Appl. Phys. vol. 46, No. 8, 8/75, pp. 3266-3272.
Pearce et al., "Aluminum . . . Devices", Appl. Phys. Lett., 39(11), 1/12/81, pp. 878-879.
J. S. Logan, Control of RF Sputtered Film Properties Through Substrate Tuning, Mar. 17, 1969, pp. 172-175.

Primary Examiner—Nam Nguyen
Attorney, Agent, or Firm—Flynn, Thiel, Boutell & Tanis

[57] ABSTRACT

When a piezoelectric film is formed on an semiconductor MOS substrate by the sputtering method, an apparatus for fabricating piezoelectric films according to the present invention can reduce damage in the MOS as far as possible.

4 Claims, 2 Drawing Sheets

APPARATUS FOR FABRICATING PIEZOELECTRIC FILMS

FIELD OF THE INVENTION

The present invention relates to an apparatus for fabricating piezoelectric films and in particular to an improvement of an apparatus for fabricating piezoelectric films for forming a piezoelectric film on a semiconductor MOS substrate by the sputtering method.

BACKGROUND OF THE INVENTION

Heretofore, in the Si IC process, etc. it is known that heat treatment of about 30 mm at 450C.° in a $H_2$ atmosphere is useful as a measure for reducing damage (damage produced by irradiation with soft X-ray or ultraviolet ray, shock by charged particles such as electrons, etc.) in an MOS (Metal Oxide Semiconductor) by a plasma process.

However, in an element (correlator, convolver, etc.), in which a piezoelectric film such as ZnO or AlN is deposited on an MOS structure by the sputtering method and interaction of the potential of surface acoustic wave (SAW) with capacitance-voltage (C-V) characteristics, etc. of the MOS structure, since peeling of the piezoelectric film or cracks are produced by heat treatment at about 450C.°, this method for reducing damage by heat treatment cannot be applied thereto.

Taking this point described above into account, when a piezoelectric film is formed by the sputtering method, a measure for reducing damage in the MOS as far as possible should be taken.

Taking a diode type RF sputtering apparatus as an example, it is known that means for setting an MOS substrate on a substrate holder has serious influences on damage in the MOS.

There are three measures, e.g. (a) the substrate holder is grounded; (b) the substrate holder is set at a floating potential; and (c) the substrate holder is set at a floating potential and in addition, an insulating plate is inserted between the substrate and the substrate holder. When these measures are compared with each other, the damage (voltage shift in the C-V characteristics of the MOS or increase in interfacial levels) in the MOS is reduced in the order of (a)→(b)→(c). That is, the damage is reduced more strongly, when the difference between the plasma potential and the potential of the substrate is as small as possible, in other words, when the potential gradient in the sheath in the neighborhood of the substrate is smaller. It seems that it can be thought that this is due to the fact that the strength of the shock by charged particles (ion or electrons) dominates the damage in the MOS in this case, although irradiation with soft X-ray or ultraviolet ray gives some damage.

However, for the measure (c) described above, it is necessary to optimize a parameter representing the thickness of the insulating plate (in the case where an insulating plate made of a predetermined material) inserted between the substrate and the substrate holder in addition to various parameters for fabrication such as gas pressure, RF power, and in the case of reactive sputtering, flow rate ration of sputter gas to reactive gas, etc.

Concretely speaking, if the thickness of the insulating plate is too great, the other parameters for fabrication being fixed, although the damage in the MOS is reduced, injection energy of the charged particles decreases, adhesive force is lowered, the stress in the film becomes tensile, and cracks are easily produced. On the contrary, if the insulating plate is too thin, the effect of reducing damage in the MOS is not satisfactory.

Consequently the thickness of the insulating film described above should be determined by trial and error for every fabrication condition and a very complicated procedure is required therefor.

OBJECT OF THE INVENTION

The present invention has been done in view of the problems described above and the object thereof is to provide an apparatus for fabricating piezoelectric films capable of reducing damage in the MOS by using extremely simple means.

SUMMARY OF THE INVENTION

According to the present invention, it is tried to solve the problems described above by constructing an apparatus for fabricating piezoelectric films, by means of which a piezoelectric film is deposited on a semiconductor MOS substrate, so that the semiconductor MOS substrate is held by a high withstand voltage insulating member and that impedance varying means is disposed, which varies the impedance between the substrate and the ground, the piezoelectric film being deposited on the substrate.

DETAILED DESCRIPTION

Figure 1:
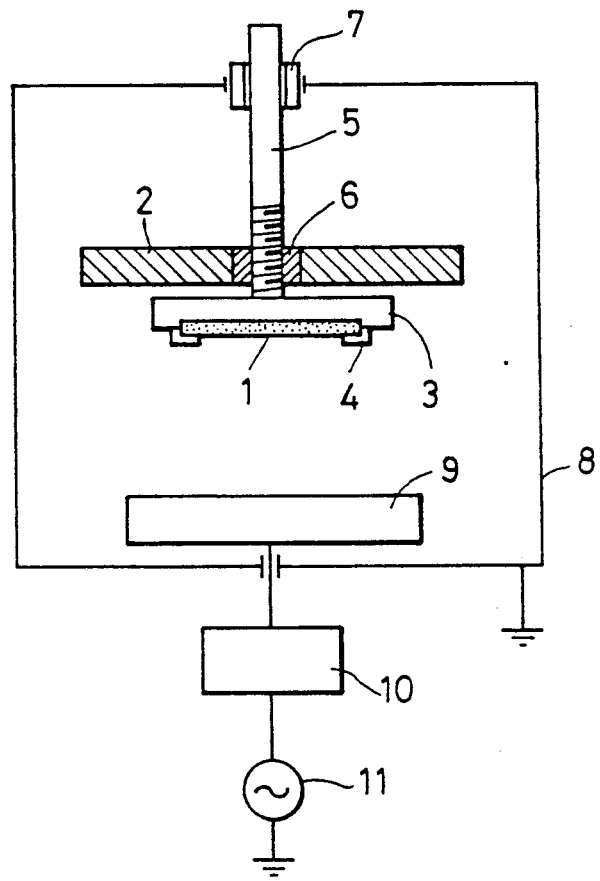
FIG. 1 is a partially cross-sectional side view of an apparatus for fabricating piezoelectric films, which is an embodiment of the present invention.
Figure 2:
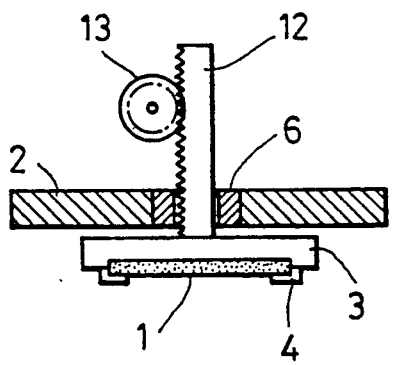
FIG. 2 is a partially cross-sectional side view of a mechanical part, which varies the position of the substrate up and downward, according to another embodiment.
Figure 3:
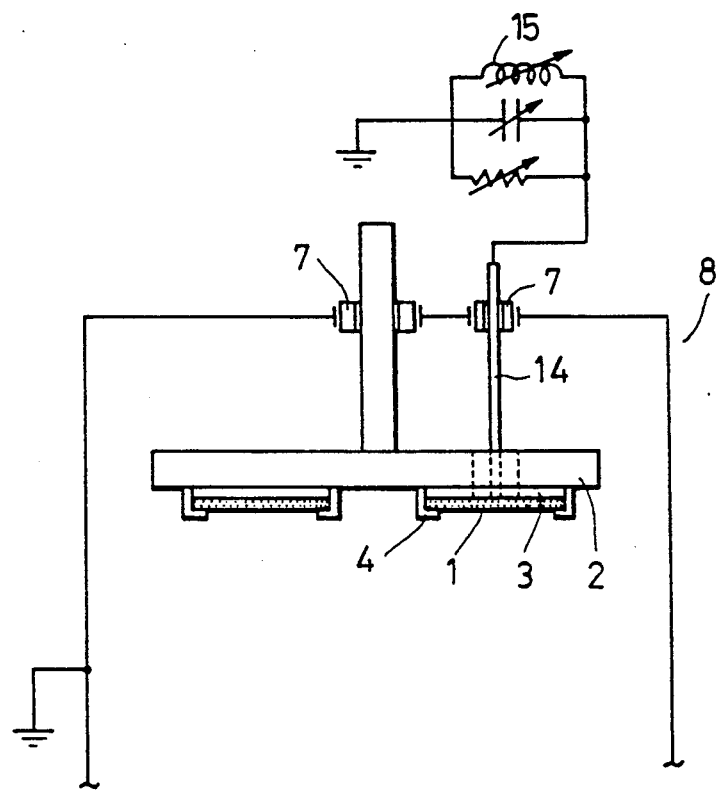
FIG. 3 is a side view of the principal part of an apparatus for fabricating piezoelectric films, which is still another embodiment of the present invention.

FIGS. 1 to 3 show different embodiments of the present invention, which will be explained by using the equivalent circuit diagram indicated in FIG. 4, in order to facilitate the understanding.

Figure 4:
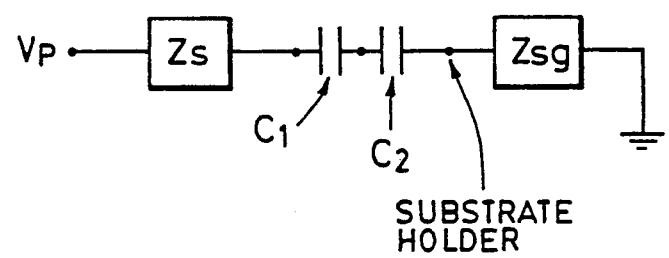
FIG. 4 is an equivalent circuit diagram.

The equivalent circuit indicated in FIG. 4 represents the measure (c) described above. The substrate sheath impedance $Z_s$ and the impedance $Z_{sg}$ between the substrate holder and the ground are represented by resistances, capacitances, diodes, etc. However it is known that they are capacitive. Here explanation will be made on the supposition that they are capacitances for the sake of simplicity.

Now, when it is supposed that the plasma potential is constant, the potential $V_p$ is divided by the capacitance $Z_s$ of the substrate sheath, the capacitance $C_1$ of the film and the semiconductor substrate, the capacitance $C_2$ due to the inserted insulting plate, and the capacitance of the impedance $Z_{sg}$ between the substrate and the chamber. That is, it can be thought that a high voltage is applied to a place having a small capacitance. Consequently, in order to alleviate the damage produced by the shock by charged particles, it is necessary to increase the impedance between the semiconductor MOS substrate and the ground to decrease the voltage allocated to the substrate sheath by the division. It is for this purpose that the insulating plate is inserted.

However, if the material for the insulating plate is determined, it can be effected only by varying the thickness thereof to vary the capacitance due to the substrate and the substrate holder by means of the insulating plate. Therefore this method has a drawback that a complicated trial as described in the measure (c) stated above should be repeated, in order to obtain the optimum capacitance. The apparatuses for fabricating piezoelectric films indicated in FIGS. 1 and 2 solve this problem.

In the apparatus indicated in FIG. 1 there is disposed a mechanism for varying the position of the substrate up and downward made of a high voltage withstanding insulating material between a semiconductor MOS substrate 1 and a metallic substrate holder 2 so that the capacitance can be varied in a simple manner without preparing insulating plates having different thicknesses. That is, reference numeral 3 is a substrate holder made of quartz; 4 is a spring grasper made of quartz; 5 is a male screw shaft made of quartz; 6 is a female nut or screw made of fluorocarbon resin; and 7 is an insulator made of ceramics such as barium titanate, etc. The substrate holder 3, the spring grasper 4, the male screw shaft 5, the female screw 6, the insulator 7, etc. constitute the mechanism for varying the position of the substrate up and downward, made of a high withstand voltage insulating material. In this way, the metallic substrate holder 2 is moved up and downward by the rotation of the male screw 5 so that the capacitance between the substrate holder 3 and the metallic substrate holder 2 is variable. In the figure, 8 is a vacuum chamber; 9 is a target; 10 is a matching circuit; and 11 is a power supply.

The substrate holder 3 constituted by an insulating plate can be moved up and downward by means of a device indicated in FIG. 2. In the figure, 12 is a rack made of fluorocarbon resin and 13 is a worm toothed wheel engaged therewith. The device is so constructed that the substrate holder 3 is moved up and downward by the rotation of the worm toothed wheel 13.

FIG. 3 shows still another embodiment of the present invention, which is so constructed that the impedance between the rear surface of the semiconductor MOS substrate and the ground can be varied so as to be adjusted from the exterior. That is, in the figure, 1 is the semiconductor MOS substrate; 2 is the metallic substrate holder; 3 is a substrate holder made of quartz; 4 is the spring grasper made of quartz; 14 is covered wire, which is covered by a high voltage withstanding insulating material such as fluorocarbon resin, polyester resin, silicon resin, etc. and which is brought into contact with the rear surface of the semiconductor MOS substrate; and 15 is a high voltage withstanding variable impedance, by means of which the impedance between the rear surface of the semiconductor and the substrate holder constituted by an insulating plate can be varied to be adjusted. Here it is supposed that an ohmic electrode is formed on the rear surface of the semiconductor MOS substrate.

By using the constructions in the various embodiments described above, it is possible to optimize rapidly the impedance between the substrate and the substrate holder in an extremely simple manner so that it is possible to reduce the voltage shift in the C-V characteristics and the interfacial levels in the MOS structure by charged particles, even if fabrication parameters for the sputtering are varied.

As described above, according to the present invention it is possible to optimize the potential gradient in the substrate sheath for every other sputtering parameter (RF power, gas pressure) in a simple manner and to minimize the damage produced in the MOS substrate by charged particles by regulating the variable impedance between the semiconductor MOS substrate and the substrate holder.

What is claimed is:

1. A piezoelectric film fabricating apparatus including piezoelectric film forming means for forming a piezoelectric film on a semiconductor MOS substrate, comprising:
   means defining a chamber;
   a target disposed in said chamber;
   a metallic substrate holder disposed in said chamber and opposed to said target;
   an insulative substrate holder which is made of a high voltage-withstanding insulating material, which is movably disposed between said metallic substrate holder and said target, and which directly supports said substrate; and
   vertical positional control means for varying the vertical distance between said metallic substrate holder and said insulative substrate holder.

2. The apparatus according to claim 11, wherein said vertical positional control means includes a threaded hole formed in said metallic substrate holder, and a threaded shaft made of a high voltage-withstanding material, said threaded shaft being rotatably received in said threaded hole and having supported thereon said insulative substrate holder.

3. The apparatus according to claim 1, wherein said vertical positional control means includes a hole formed in said metallic substrate holder, a gear member made of a high voltage-withstanding insulating material and extending through said hole, said gear member having said insulative substrate holder supported thereon and having a gear portion, and a driving gear engaging said gear portion of said gear member.

4. A piezoelectric film fabricating apparatus including piezoelectric film forming means for forming a piezoelectric film on a semiconductor MOS substrate, comprising:
   means defining a chamber;
   a target disposed in said chamber;
   a metallic substrate holder disposed in said chamber at a location spaced above said target;
   an insulative substrate holder which is made of a quartz material having a high voltage-withstanding insulating characteristic, which is disposed between said metallic substrate holder and said target, and which has quartz spring grasper portions directly supporting said substrate thereon on a side thereof facing said target so that said substrate is forcibly pressed against said insulative substrate holder; and
   vertical positional control means for varying the vertical distance between said metallic substrate holder and said insulative substrate holder, said vertical positional control means including said metallic substrate holder having an opening therein, including a nut disposed in said opening and made of a fluorocarbon resin, including a ceramic insulator disposed in a top wall of said chamber and having a vertical opening therethrough, and including a threaded shaft made of a quartz material having a high voltage-withstanding characteristic, said threaded shaft rotatably threadedly engaging a threaded hole in said nut, rotatably extending through said opening in said ceramic insulator, and having fixedly supported on a lower end thereof said insulative substrate holder.

* * * * *

UNITED STATES PATENT AND TRADEMARK OFFICE
CERTIFICATE OF CORRECTION

PATENT NO. : 5,092,978
DATED : March 3, 1992
INVENTOR(S) : Kiyoaki KOJIMA et al

It is certified that error appears in the above-indentified patent and that said Letters Patent is hereby corrected as shown below:

On the title page, immediately below the line in the left column which sets forth the filing date, please add the following:

---[30] Foreign Application Priority Data
December 28, 1989 [JP] Japan...1-341190---.

Column 4, line 21; replace "11" with ---1---.

Signed and Sealed this

Twenty-ninth Day of June, 1993

Attest:

MICHAEL K. KIRK

Attesting Officer

Acting Commissioner of Patents and Trademarks